(12) United States Patent
Park (10) Patent No.: US 8,729,563 B2
(45) Date of Patent: May 20, 2014

(54) SOLID STATE LIGHTING DEVICES WITH SELECTED THERMAL EXPANSION AND/OR SURFACE CHARACTERISTICS, AND ASSOCIATED METHODS

(75) Inventor: Ji-Soo Park, Andover, MA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/617,846

(22) Filed: Sep. 14, 2012

(65) Prior Publication Data

US 2013/0062615 A1 Mar. 14, 2013

Related U.S. Application Data

(62) Division of application No. 12/861,706, filed on Aug. 23, 2010, now Pat. No. 8,436,362.

(60) Provisional application No. 61/236,300, filed on Aug. 24, 2009, provisional application No. 61/261,065, filed on Nov. 13, 2009.

(51) Int. Cl.
*H01L 33/32* (2010.01)

(52) U.S. Cl.
USPC .................. 257/76; 257/E33.025; 438/47

(58) Field of Classification Search
USPC .................. 257/76, E33.025; 438/47
See application file for complete search history.

(56) References Cited

U.S. PATENT DOCUMENTS

| 7,732,301 B1 | 6/2010 | Pinnington et al. |
| 2004/0026699 A1 | 2/2004 | Baur et al. |
| 2006/0021565 A1 | 2/2006 | Zahler et al. |
| 2006/0112986 A1 | 6/2006 | Atwater, Jr. et al. |
| 2006/0185582 A1 | 8/2006 | Atwater, Jr. et al. |
| 2006/0255341 A1 | 11/2006 | Pinnington et al. |
| 2007/0243703 A1 | 10/2007 | Pinnington et al. |

(Continued)

FOREIGN PATENT DOCUMENTS

| JP | 2003298109 A | 10/2003 |
| JP | 2008258561 A | 10/2008 |

(Continued)

OTHER PUBLICATIONS

Abe, Y. et al., Semipolar Nitrides Grown on 51(001) Offcut Substrates with 3C-SiC Buffer Layers, Materials Science Forum, vols. 600-603, pp. 1281-1284, Sep. 2008.

(Continued)

*Primary Examiner* — Marc Armand
(74) *Attorney, Agent, or Firm* — Perkins Coie LLP (57) ABSTRACT

Solid state lighting (SSL) devices and methods are disclosed. A particular method includes forming an SSL formation structure having a CTE, selecting a first material of an interlayer structure to have a first material CTE greater than the substrate CTE, and selecting a second material based at least in part on the second material having a CTE less than the first material CTE. The intelayer structure is formed over the SSL formation structure e.g., with a first layer of the first material over the SSL formation structure, a portion of the second material over the first material, and a second layer of the first material over the second material. The CTE difference between the first and second materials can counteract a force placed on the formation structure by the first material. Particular formation structures can have an off-cut angle with a non-zero value of up to about 4.5 degrees.

20 Claims, 8 Drawing Sheets

(56) References Cited

U.S. PATENT DOCUMENTS

| | | | |
|---|---|---|---|
| 2008/0157102 A1 | 7/2008 | Hori et al. | |
| 2008/0224268 A1 | 9/2008 | Abe et al. | |
| 2010/0051939 A1* | 3/2010 | Shinagawa et al. | 257/43 |
| 2010/0052008 A1* | 3/2010 | Masui et al. | 257/103 |
| 2010/0096615 A1 | 4/2010 | Okamoto et al. | |
| 2011/0121310 A1 | 5/2011 | Park | |

FOREIGN PATENT DOCUMENTS

| | | |
|---|---|---|
| JP | 2009505377 T | 2/2009 |
| KR | 100793443 B1 | 1/2008 |
| KR | 20080047836 A | 5/2008 |

OTHER PUBLICATIONS

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.

Atwater, H.A. et al., Zone-Melting Recrystallization of Thick Silicon on Insulator Films, Materials Letters, vol. 2, No. 4A, pp. 269-273, Mar. 1984.

Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.

Colinge, J.-P., Silicon-on-Insulator Technology: Materials to VLSI, 2nd Edition, pp. 16-27 and 52-65, Sep. 1997.

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.I., Graphoepitaxy as an Approach to Oriented Crystallization on Amorphous Substrates, Journal of Crystal Growth, vol. 310, No. 7-9, pp. 1686-1690, Apr. 2008.

International Search Report and Written Opinion issued Mar. 23, 2011 in International Application No. PCT/US2010/046535, 9 pages.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.

Wan, J. et al., Growth of Crack-Free Hexagonal GaN Films on Si(100), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

* cited by examiner

SOLID STATE LIGHTING DEVICES WITH SELECTED THERMAL EXPANSION AND/OR SURFACE CHARACTERISTICS, AND ASSOCIATED METHODS

CROSS-REFERENCE TO RELATED APPLICATIONS

The present application is a divisional of U.S. application Ser. No. 12/861,706 filed on Aug. 23, 2010, now U.S. Pat. No. 8,436,362 and claims priority to U.S. Provisional Application No. 61/236,300 filed on Aug. 24, 2009, and U.S. Provisional Application No. 61/261,065 filed on Nov. 13, 2009, each of which is incorporated herein by reference. To the extent that any material in the present application conflicts with the disclosures of the foregoing Provisional Applications, the material of the present application controls.

TECHNICAL FIELD

The present disclosure is related to solid state lighting ("SSL") devices with selected thermal expansion characteristics, and/or surface characteristics, and associated methods, including methods of manufacturing.

BACKGROUND

Figure 1A:
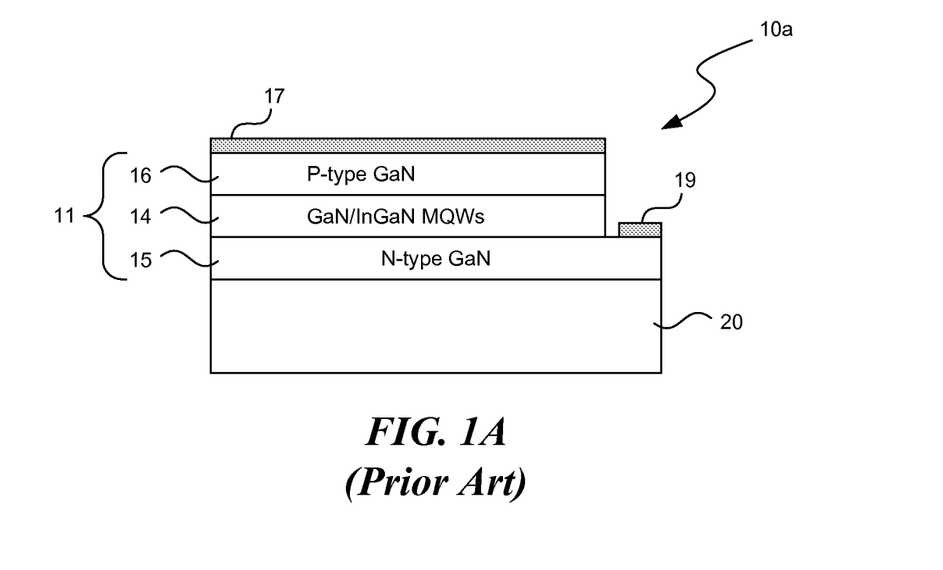
FIG. 1A is a schematic cross-sectional diagram of an SSL device in accordance with the prior art.
Figure 1B:
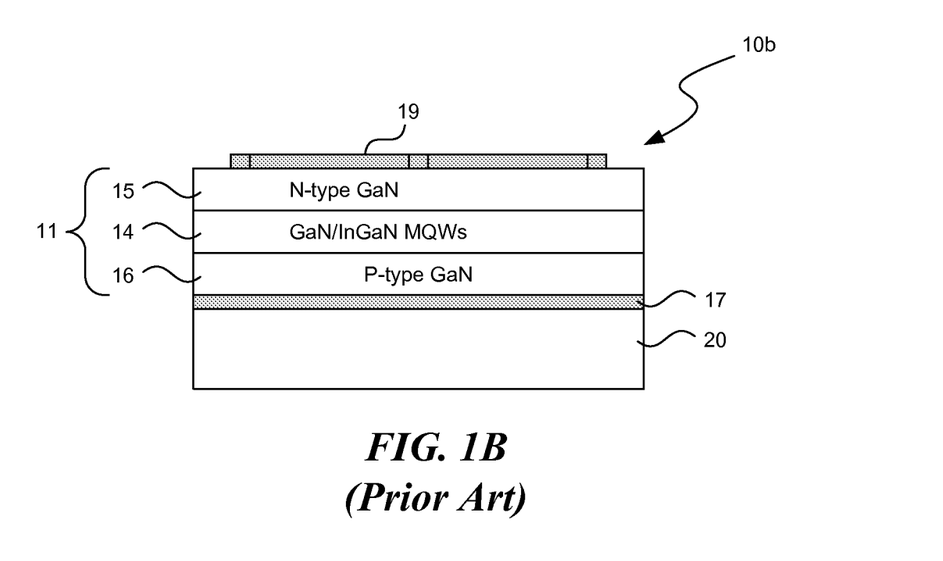
FIG. 1B is a schematic cross-sectional diagram of another SSL device in accordance with the prior art.

Mobile phones, personal digital assistants ("PDAs"), digital cameras, MP3 players, and other portable electronic devices utilize SSL devices (e.g., LEDs) for background illumination. SSL devices are also used for signage, indoor lighting, outdoor lighting, and other types of general illumination. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15, and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. FIG. 1B is a cross-sectional view of another conventional LED device 10b in which the first and second contacts 17 and 19 are opposite of each other, e.g., in a vertical rather than lateral configuration. In the LED device 10b, the first contact 17 typically includes a reflective and conductive material (e.g., aluminum) to direct light toward the N-type GaN 15.

As discussed in more detail below, the various elements of the SSL devices typically have different coefficients of thermal expansion (CTE). During temperature excursions that occur in manufacturing processes and/or during use, the difference in CTEs of the device elements may cause the elements to delaminate. In addition, as is also discussed in more detail below, several elements of the SSL device are grown epitaxially on the substrate 20. It is accordingly desirable to control the growth of the materials forming these elements in a manner that improves the performance and reliability of the resulting device.

DETAILED DESCRIPTION

Various embodiments of SSL devices with particularly selected thermal expansion coefficients and/or surface characteristics, and associated methods are described below. As used hereinafter, the term "SSL device" generally refers to devices with light emitting diodes ("LEDs"), organic light emitting diodes ("OLEDs"), laser diodes ("LDs"), polymer light emitting diodes ("PLEDs"), and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 2A-7.

Figure 2A:
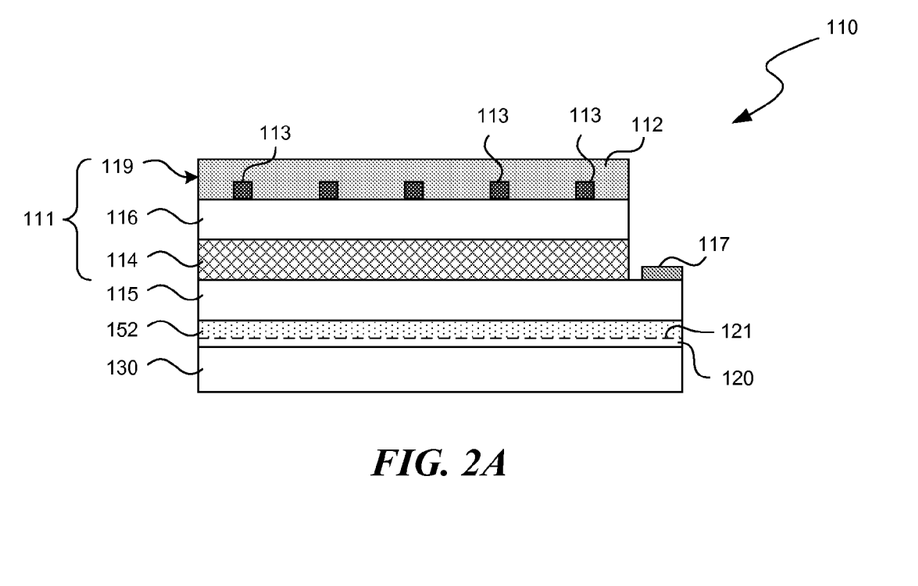
FIG. 2A is a cross-sectional view of an SSL device in accordance with embodiments of the present technology.

FIG. 2A is a schematic cross-sectional diagram of an SSL device 110 with lateral contacts in accordance with embodiments of the technology. As shown in FIG. 2A, the SSL device 110 can include an SSL formation structure 120 carried by a support member 130. The SSL device 110 can further include an optional buffer material 152. The SSL formation structure 120 carries an SSL structure 111 that includes an active region 114 (e.g., an SSL emitter material), positioned in series between a first semiconductor material 115 and a second semiconductor material 116. The SSL device 110 can also include a first contact 117 on the first semiconductor material 115 and a second contact 119 on the second semiconductor material 116 to provide power to the SSL structure 111. In the illustrated embodiment, the first and second contacts 117, 119 are arranged laterally relative to each other. In other embodiments, the contacts 117, 119 can be arranged vertically relative to each other, or can have other suitable configurations. In any of these embodiments, the SSL device 110 can optionally include a reflective material (e.g., a silver film), a carrier material (e.g., a ceramic substrate), an optical component (e.g., a collimator), and/or other suitable components for enhancing the efficiency and/or other characteristics of the SSL device 110, including but not limited to the quality of the emitted light.

In certain embodiments, the SSL formation structure 120 can include silicon (Si), at least a portion of which has the Si(1,1,1) crystal orientation. In other embodiments, the formation structure 120 can include silicon with other crystal orientations (e.g., Si(1,0,0)), aluminum gallium nitride (AlGaN), GaN, silicon carbide (SiC), sapphire ($Al_2O_3$), zinc oxide ($ZnO_2$), a combination of the foregoing materials and/or other suitable materials. In the illustrated embodiment, the SSL formation structure 120 has a first surface 121 proximate to the optional buffer material 152 that is off-cut, as described in further detail later with reference to FIGS. 2B-2C. In other embodiments, the first surface 121 of the formation structure 120 may have other characteristics, e.g., openings, channels, and/or other surface features, not shown in FIG. 2A.

The optional buffer material 152 can facilitate the formation of the first and second semiconductor materials 115, 116 and the active region 114 on the SSL formation structure 120. In certain embodiments, the optional buffer material 152 can include at least one of aluminum nitride (AlN), AlGaN, zinc nitride (ZnN), GaN, and/or other suitable materials. In other embodiments, the optional buffer material 152 may be omitted, and the first semiconductor material 115 may be formed directly on the formation structure 120, or on an intermediate interlayer structure, which is described in more detail later with reference to FIGS. 5D-6B.

The first and second semiconductor materials 115, 116 can be configured as cladding components for the active region 114. In certain embodiments, the first semiconductor material 115 can include N-type GaN (e.g., doped with silicon (Si)), and the second semiconductor material 116 can include P-type GaN (e.g., doped with magnesium (Mg)). In other embodiments, the first semiconductor material 115 can include P-type GaN, and the second semiconductor material 116 can include N-type GaN. In further embodiments, the first and second semiconductor materials 115, 116 can each include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials. Additionally, the P-type GaN and/or N-type GaN can also be doped with silicon.

The active region 114 can include a single quantum well ("SQW"), multiple quantum wells ("MQWs"), and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 114 can include an InGaN SQW, GaN/InGaN MQWs, and/or an InGaN bulk material. In other embodiments, the active region 114 can include aluminum gallium indium phosphide (AlGaInP), aluminum gallium indium nitride (AlGaInN), and/or other suitable materials or configurations.

In certain embodiments, the first semiconductor material 115, the active region 114, the second semiconductor material 116, and the optional buffer material 152 can be formed on the formation structure 120 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components may be formed via other suitable epitaxial growth techniques. As explained in more detail below, significant internal stresses are induced between the formation structure 120 and at least the first semiconductor material 115 as the assembly cools following epitaxial processes.

In certain embodiments, the first contact 117 can include copper (Cu), aluminum (Al), silver (Ag), gold (Au), platinum (Pt), and/or other suitable conductive material. In other embodiments, the first contact 117 can include ITO, aluminum zinc oxide ("AZO"), fluorine-doped tin oxide ("FTO"), and/or other suitable transparent and conductive oxide ("TCOs"). Techniques for forming the first contact 117 can include MOCVD, MBE, spray pyrolysis, pulsed laser deposition, sputtering, electroplating, and/or other suitable deposition techniques. The second contact 119 can include a suitable conductive material 112 and a suitable contact material 113 between the second semiconductor material 108 and the conductive material 112. The conductive material 112, for example, can be a transparent conductive material.

Figure 2B:
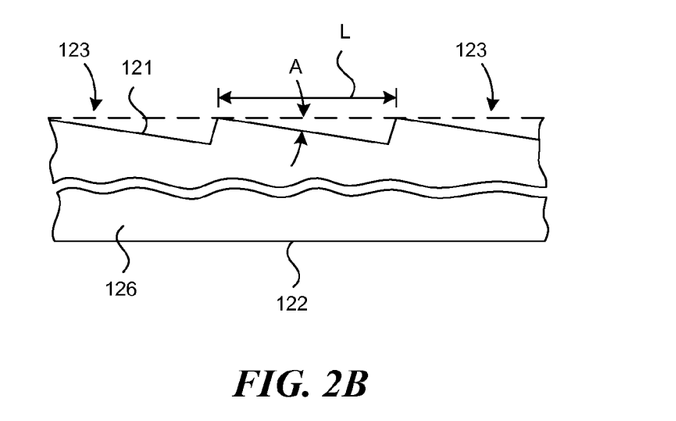
FIG. 2B is a schematic illustration of a portion of an SSL substrate that is off-cut in accordance with an embodiment of the present technology.

FIG. 2B is a partially schematic, enlarged illustration of a portion of an SSL substrate 126 that is off-cut in accordance with embodiments of the present technology. The substrate 126 is exfoliated in a subsequent process step to produce the SSL formation structure 120 described above. The SSL substrate 126 has a first surface 121 and a second surface 122 facing away from the first surface 121. The first surface 121 (and, in at least some embodiments, the second surface 122) is off-cut using techniques known to those of ordinary skill in the relevant art, at a selected off-cut angle A. Off-cutting the SSL substrate 126 in this manner can produce a series of terraces 123 at the first surface 121, each having a terrace length L.

Figure 2C:
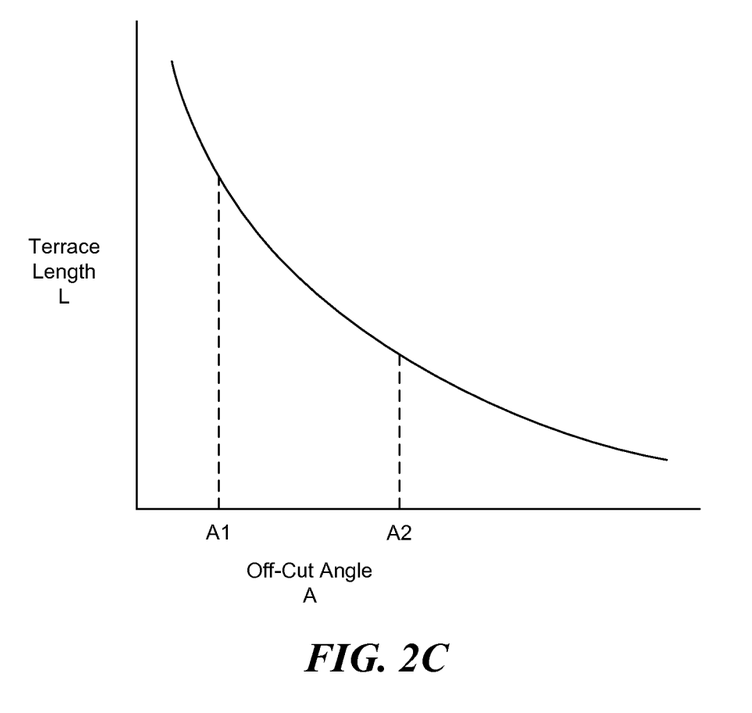
FIG. 2C is a graph illustrating a range of off-cut angles suitable for use with SSL substrates in accordance with the present technology.

FIG. 2C is a graph illustrating the terrace length L as a function of the off-cut angle A. FIG. 2C illustrates that for shallow off-cut angles A, the terrace length L is relatively large, and for steeper off-cut angles A, the terrace length L is relatively short. In particular embodiments, off-cut angles A between A1 and A2 produce beneficial effects describes further below. In a further particular aspect of these embodiments, the lower bound of the off-cut angle range A1 is any non-zero value, and in yet a further particular aspect, has a value of about 0.5°. The upper bound of the off-cut angle range, identified by angle A2, can have a value of less or at least not more than about 4.5°, and in a particular embodiment, an angle of about 4°. In still further particular embodiments, A2 can have a value of about 2°.

Figure 3A:
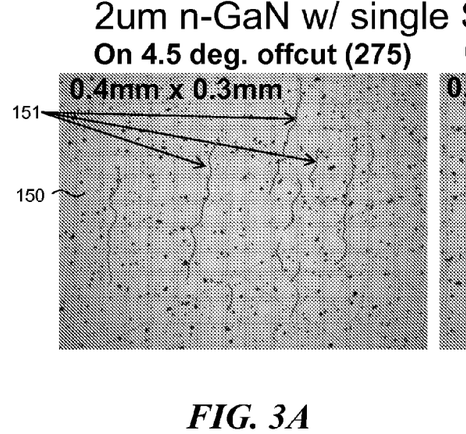
FIG. 3A is an enlarged illustration of waves formed in an overlayer on an SSL substrate having a 4.5° off-cut angle.
Figure 3B:
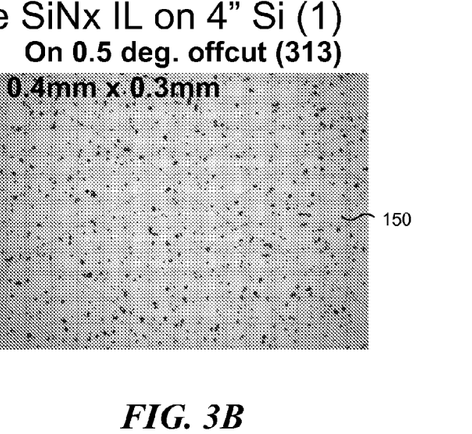
FIG. 3B is an enlarged illustration of an overlayer on an SSL substrate having a 0.5° off-cut angle.

FIGS. 3A and 3B compare the results obtained when materials are disposed on SSL substrates having different off-cut angles. For example, FIG. 3A illustrates a first SSL substrate having an overlayer 150 disposed on the first surface. In a particular embodiment, the first SSL substrate can include a 4 inch silicon wafer, and the overlayer 150 can include two-micron n-GaN with a single silicon nitride (e.g., $S_3N_4$ or SiNx) interlayer. The first SSL substrate has been off-cut at an angle of 4.5°, and produces a series of waves 151 in the overlayer 150, which have been enhanced for clarity in FIG. 3A. By contrast, a second SSL substrate having a 0.5° off-cut angle (shown in FIG. 3B) produces no visible waves at the same level of magnification.

Figure 4A:
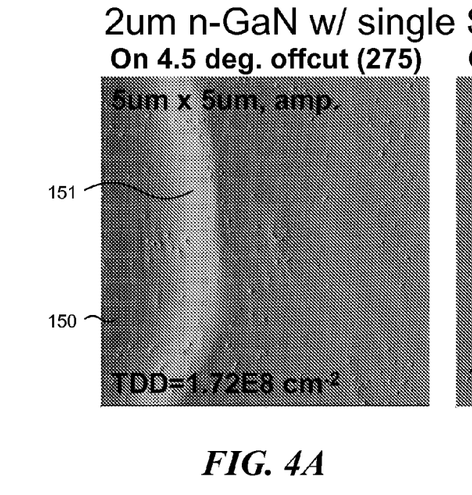
FIG. 4A is a further enlarged view of the structure shown in FIG. 3A.
Figure 4B:
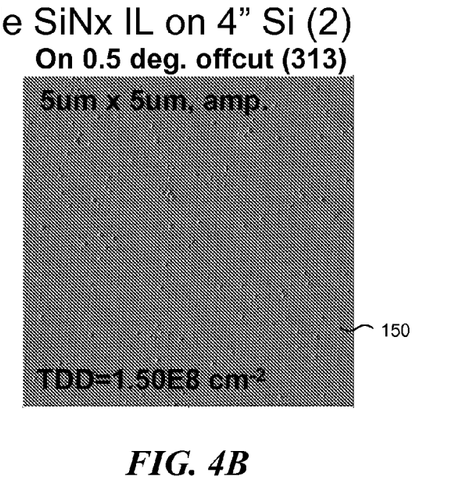
FIG. 4B is a further enlarged view of the structure shown in FIG. 3B.

FIGS. 4A and 4B are further enlarged illustrations of portions of the first SSL substrate and the second SSL substrate, respectively. FIG. 4A illustrates a representative one of the waves 151 produced in the overlayer 150 when the first SSL substrate is off-cut at an angle of 4.5°. FIG. 4B illustrates an analogous region of the overlayer 150 disposed on the second SSL substrate (off-cut at 0.5°), which has much smaller or even no waves at the same level of magnification. Accordingly, a method in accordance with the present technology includes selecting an off-cut angle that is less than an angle expected to produce a threshold level of waves in the overlayer 150. In one embodiment, the threshold level is zero and in other embodiments, the threshold level has a non-zero value.

It is expected that by off-cutting the SSL substrate 126 at a value within the foregoing ranges (e.g., a non-zero value less than 4.5°, or a value of between about 0.5° and about 2°) the characteristics of layers disposed on the resulting SSL formation structure 120 can be enhanced. In particular, it is expected that the crystal structures grown on the SSL formation structure 120, such as AlN and/or GaN, can be aligned in a more stable state. As a result, it is expected that the aligned crystal structures produced by the appropriate degree of off-cut may reduce defects in subsequently formed layers. For example, the foregoing methodology can improve the uniformity and alignment of one or more GaN layers applied to the SSL formation structure 120 during the formation of LED devices. In selected embodiments, the higher temperature and/or increased nitrogen-to-gallium ratio present during the formation of SiNx in an interlayer structure may intensify the step bunching effects that create the waves shown in FIGS. 3A and 4A. Selecting a non-zero off-cut angle not greater than 4.5°, and generally less than 4.5°, can reduce or eliminate this effect. The amount of SiNx in the interlayer structure can determine the off-cut angle. For example, the SiNx can be distributed relatively thickly to cover more surface area for SSL formation structures with lower off-cut angles, and more thinly to cover less surface area for SSL formation structures with higher off-cut angles. Further steps in the interlayer formation process are described below with reference to FIG. 5A-5E.

Figure 5A:
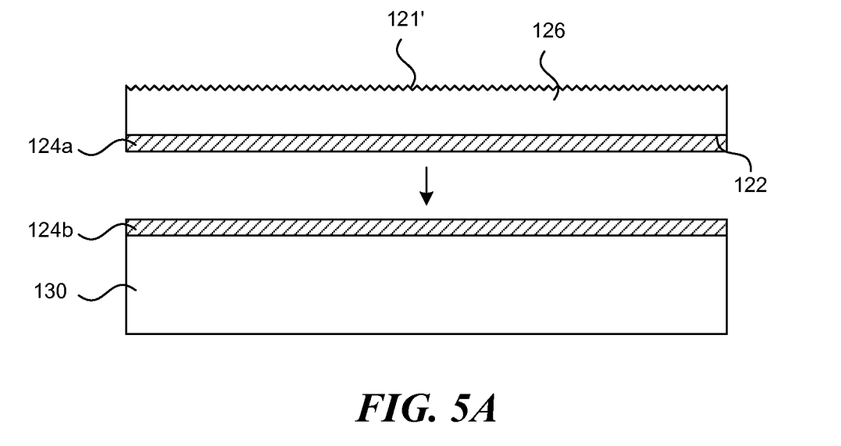
FIG. 5A is a schematic illustration of a process for bonding an SSL substrate to a support member in accordance with the present technology.

Referring now to FIG. 5A, an SSL substrate 126 having an off-cut first surface 121' is shown positioned over a support member 130. The support number 130 can include a suitable material having a coefficient of thermal expansion (CTE) selected to match or at least suitably approximate the CTEs of layers formed on the SSL substrate 126 during subsequent processing steps. The SSL substrate 126 may have a CTE that differs significantly from that of the subsequently formed layers, e.g., when the SSL substrate 126 includes silicon, and the subsequent layer includes GaN. Accordingly, the CTE of the support member 130 can be selected to be closer to the CTE of the subsequent layers than is the CTE of the SSL substrate 126, and the thickness of the support member 130 can be large enough relative to the thickness of the formation structure obtained from the SSL substrate 126 to control the thermal expansion of the thin SSL formation structure 126. Accordingly, when the subsequently-formed layers include GaN, the support member 130 can include GaN, molybdenum, or, in particular embodiments, polyaluminum nitride (pAlN), which is expected to control the thermal expansion of the SSL formation structure to better approximate that of the buffer material and/or the subsequently-formed semiconductor materials in a cost-effective manner.

Figure 5B:
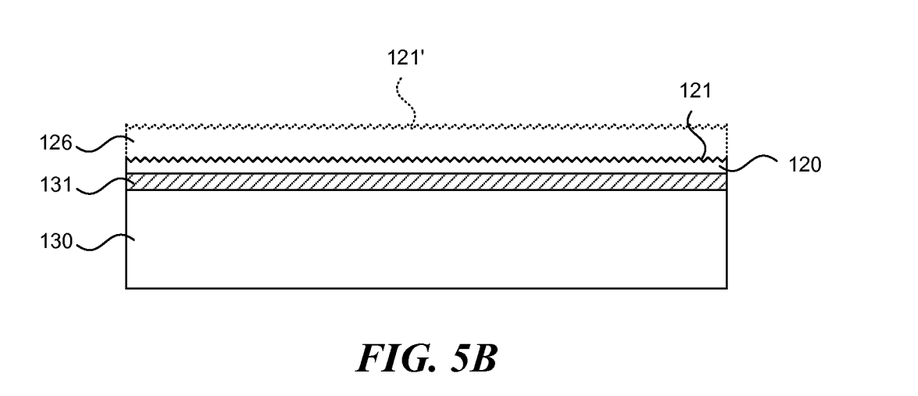
FIG. 5B is a schematic illustration of the structure resulting from the process conducted in FIG. 5A.

A first bonding layer 124a is disposed on the second surface 122 of the SSL substrate 126, and a corresponding second bonding layer 124b is disposed on the support member 130. As shown in FIG. 5B, the two bonding layers 124a, 124b are brought into contact with each other to form a bond region 131 between the SSL substrate 126 and the support member 130. Depending on the application, a portion of the substrate 126 (shown in dotted lines) is removed using known exfoliation processes to leave a thin SSL formation structure 120 of the substrate 126 bonded to the support substrate 130. The SSL formation structure 120 has an exposed first surface 121.

Figure 5C:
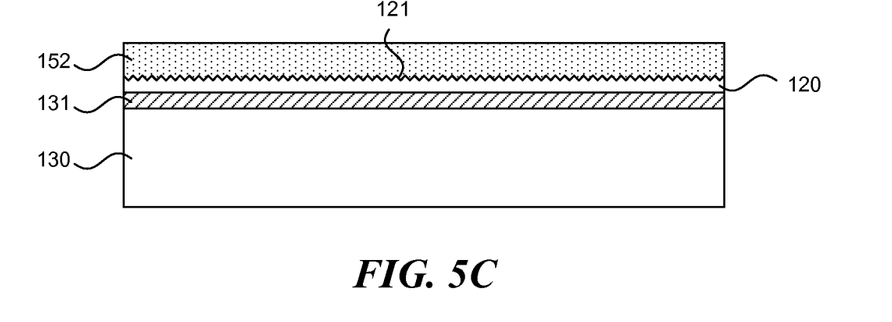
FIGS. 5C-5E illustrate a process for forming an interlayer structure in accordance with the present technology.

FIG. 5C illustrates the formation of an optional buffer material 152 on the first surface 121 of the SSL formation structure 120. The buffer material 152 can include AN, AlGaN, or another suitable material that is grown on the SSL formation structure 120. As discussed above, the off-cut angle at the first surface 121 can align the crystals of the buffer material 152 in a more stable state.

Figure 5D:
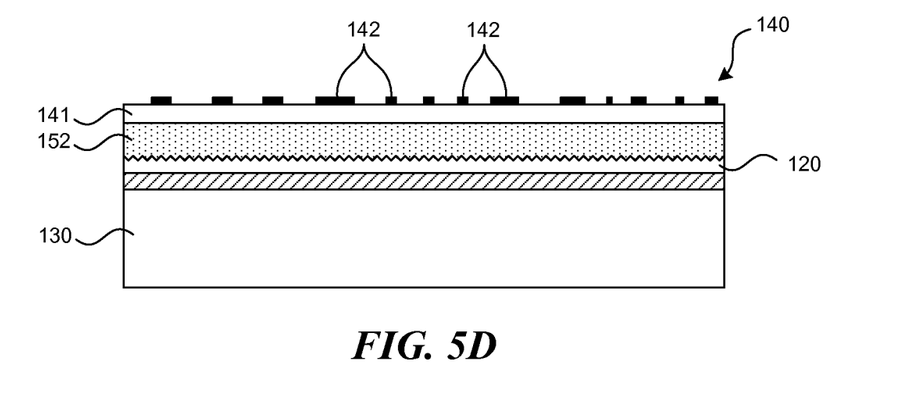
Figure 5E:
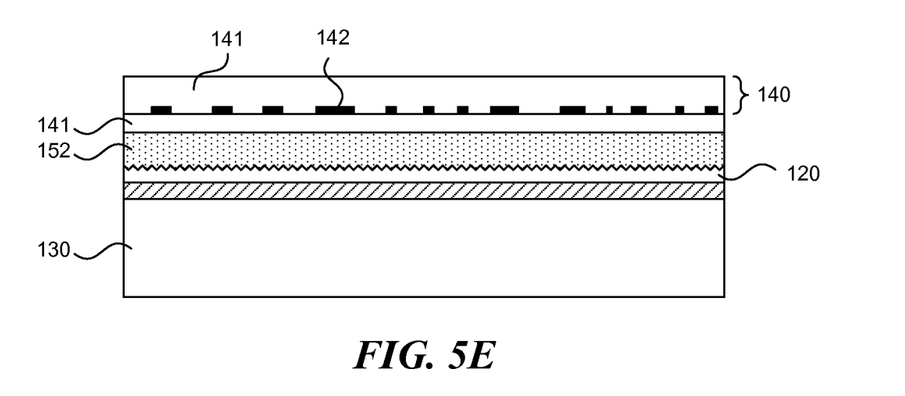

FIGS. 5D and 5E illustrate the formation of an interlayer structure 140 carried by the SSL formation structure 120. In a particular embodiment, the interlayer structure 140 is formed on the buffer material 152. In other embodiments for which the buffer material 152 is omitted, the interlayer structure 140 can be formed directly on the SSL formation structure 120. The interlayer structure 140 includes at least two materials, shown in FIG. 5D as a first material 141 and a second material 142. In a representative embodiment, the first material 141 includes GaN, and the second material 142 includes silicon nitride, though in other embodiments these materials can include other elements/compounds. The first material 141 is grown over the SSL formation structure 120 to form a generally uniform layer. The second material 142 typically does not form a uniform, continuous layer, but instead forms discontinuous, discrete and/or spaced-apart volumes on the first material 141. One purpose of the second material 142 is to block dislocations or other defects formed in the underlying layer of the first material 141 from propagating into subsequently grown layers of the first material 141 or other materials grown on the underlying layers of the first material 141. Accordingly, multiple layers of the first material 141 may be grown in a stacked manner on the SSL formation structure 120, each with a successively greater layer thickness and reduced defect level, and each separated from its neighbor by a quantity of the second material 142, until a first material layer with an adequate thickness and an acceptably low number and/or density of defects is obtained.

In FIG. 5E, a second layer of the first material 141 is disposed on the second material 142 and (where the second material 142 does not cover the underlying first material 141), on the underlying first material 141. The combination of the two first material layers 141 and the interposed second material 142 forms a representative interlayer structure 140. The foregoing process may be repeated to produce additional layers of the first material 141, with each successive first material layer generally having fewer defects (by virtue of the blocking effect provided by the second material 142 below) and a successively increasing thickness.

Figure 6A:
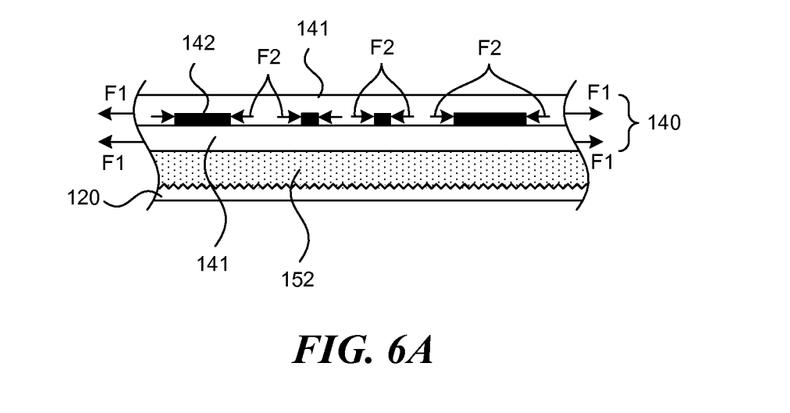
FIG. 6A is a schematic illustration of forces on elements of the interlayer structure shown in FIG. 5E.

FIG. 6A is an enlarged illustration of a portion of the interlayer structure 140 shown in FIG. 5E, with characteristics of the first and second materials 141, 142 selected to enhance the resulting SSL device. In particular embodiment, the first material 141 (e.g., GaN) has a CTE that is significantly different (e.g., higher) than the CTE of the SSL formation structure 120. Accordingly, when the resulting SSL device 110 (FIG. 2A) undergoes temperature excursions, the layers within the SSL device 110 will expand or contract by different amounts and induce delamination forces between the different materials. The buffer material, semiconductor materials, and interlayer structure 140 are formed at high temperatures. As a result, when the resulting SSL device 110 is cooled after the epitaxial or other high temperature processes, the first material 141 will contract more than the SSL formation structure 120. This induces tension in the first material 141 and compression in the SSL formation structure 120. By selecting the CTE of the second material 142 to be less than that of the first material 141, the second material 142 can provide a counterforce that reduces the tendency for the layers of the first material 141 to deform, delaminate, and/or otherwise undergo a damaging or destructive process. Accordingly, the force on the first material 141 (indicated by arrows F1) can be counteracted by the oppositely directed force provided by the second material 142 (indicated by arrows F2) to produce the desired composite CTE. For example, the second material 142 can be selected to have a CTE that is less than that of the first material 141, but still greater than that of the SSL formation structure 120. In a particular example, the second material 142 can include SiNx when the first material 141 includes GaN. In other embodiments, these materials can have other compositions. In still further embodiments, the second material 142 can be selected to have a CTE that is less than that of both the first material 141 and the SSL formation structure 120, so long as the combined or composite CTE of the first material 141 and the second material 142 is not so far below the CTE of the SSL formation structure 120 as to result in compressive (rather than tensile) stresses in the first material 141.

The technique for manufacturing the interlayer structure 140 can include other features that also reduce the stresses in the first material 141. For example, the first material 141 can be doped with silicon and/or another suitable material, e.g. in addition to interspersing the second material 142 between layers of the first material 141. In other embodiments, the first material can be doped with other constituents of a suitable SSL formation structure 120.

In a particular embodiment described above with reference to FIGS. 5D-5E, the first material 141 is positioned directly on the buffer material 152, or, if the buffer material 152 is omitted, directly on the SSL formation structure 120. In another embodiment shown in FIG. 6B, the second material 142 can be formed on the buffer material 152 or, if the buffer material 152 is omitted, directly on the SSL formation structure 120. In either embodiment, the interlayer structure 140 includes at least two layers of the first material 141, with the second material 142 disposed between the two layers.

Figure 6B:
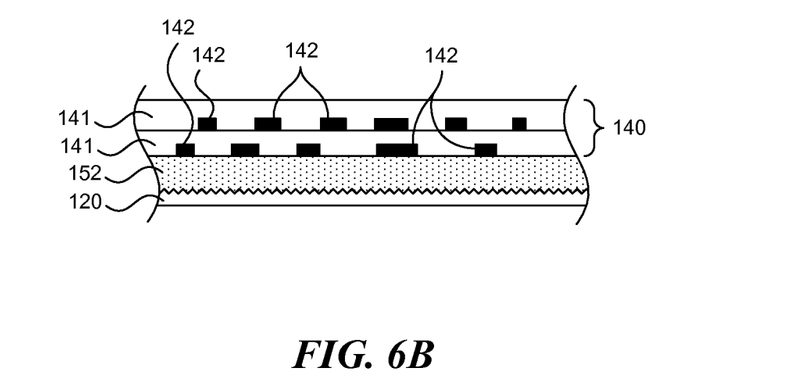
FIG. 6B is a schematic illustration of an interlayer structure having elements arranged in accordance with another embodiment of the present technology.

In any of the foregoing embodiments, the forces on the first material 141 can be reduced more effectively by locating the second material 142 close to the SSL formation structure 120. Accordingly, it may be beneficial to dispose the second material 142 directly on the SSL formation structure 120, or directly on the buffer material 152. If the first quantity of the second material 142 in the interlayer structure is not disposed directly on the SSL formation structure 120 or directly on the buffer material 152, it may nevertheless be beneficial to dispose the second material 142 in close proximity to both the SSL formation structure 120 and the buffer material 152, e.g., within 300 nm of the buffer material 152.

Figure 7:
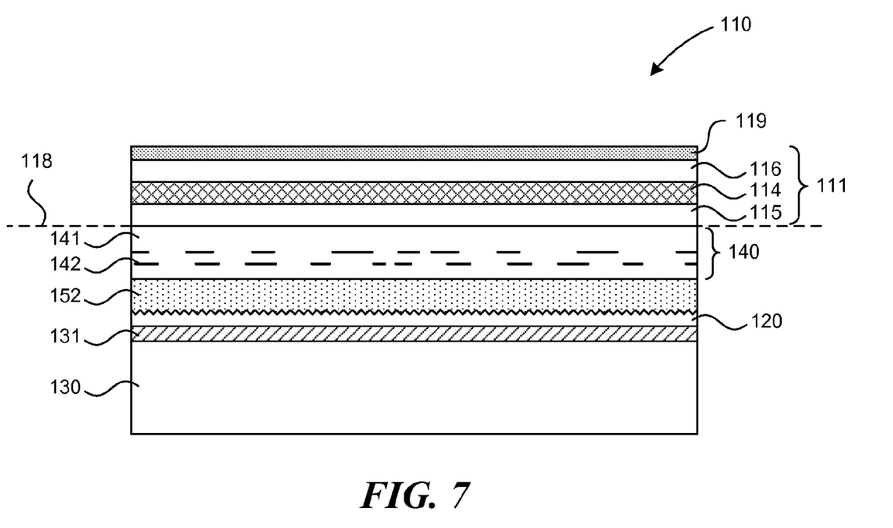
FIG. 7 is a schematic illustration of elements of an SSL device configured in accordance with an embodiment of the present technology.

FIG. 7 is a schematic illustration of the SSL device 110 after the SSL structure 111 is formed on the interlayer structure 140. The SSL structure 111 can include a first semiconductor material 115 (e.g., an N-type GaN), an active region 114 (e.g., including InGaN), and a second semiconductor material 116 (e.g., a P-type GaN). The SSL structure 111 can further include a first contact 117 (e.g., a P-type contact). In a particular embodiment, a portion of the first contact 117, the second semiconductor material 116, and active region 114 can be removed to expose a portion of the first semiconductor material 115 below, thus allowing the formation of the second contact 119, as shown in FIG. 2A. In this embodiment, the entire structure can be packaged and incorporated into an end-user device, or the interlayer structure 140 and elements below it can be separated from the rest of the SSL device 110 as indicated by a separation line 118. If the SSL device 110 is separated at the separation line 118, the lower surface of the first conductive material 115 is exposed, allowing the formation of the second contact in a vertical rather than lateral orientation. In any of the foregoing embodiments, it is expected that selecting the first and second materials 141, 142 of the interlayer structure 140, and/or selecting the appropriate off-cut angle for the SSL substrate 126 and resulting formation structure 120 can improve the reliability, efficiency, and/or producability of the resulting SSL device 110.

From the foregoing, it will be appreciated that specific embodiments of the technology have been described herein for purposes of illustration, but that various modifications may be made without deviating from the technology. For example, the interlayer structure can have different numbers and/or arrangements of layers than shown in the Figures, depending upon the specific implementation and/or other factors. Materials other than SiNx can be used to provide the counterforce on the GaN (or other) layers of the interlayer structure. Such materials include, but are not limited to, silicon oxide, aluminum oxide and gallium oxide. Certain aspects of the technology described in the context of particular embodiments may be combined or eliminated in other embodiments. For example, the buffer material 152 may be eliminated in some embodiments. In some embodiments, the SSL device 110 can include an interlayer structure having the first and second materials selected on the basis of CTE characteristics, without also including an off-cut SSL formation structure. In other embodiments, the SSL device can include an off-cut SSL formation structure, without an interlayer structure that includes materials selected based on CTE characteristics. Further, while advantages associated with certain embodiments of the technology have been described in the context of those embodiments, other embodiments may also exhibit such advantages, and not all embodiments need necessarily exhibit such advantages to follow within the scope of the present disclosure. Accordingly, the disclosure and associated technology can encompass other embodiments not expressly shown or described herein.

I claim:

1. A solid state lighting (SSL) device, comprising:
   a support member;
   a silicon SSL formation structure carried by the support member, the silicon SSL formation structure having a first surface facing toward the support member and a second surface facing oppositely away from the first surface, the second surface having an off-cut angle with a non-zero value up to about 4.5°; and
   an SSL structure carried by the silicon SSL formation structure, the SSL structure including a P-type region, an N-type region, and an active region between the P-type region and the N-type region.

2. The device of claim 1, wherein the off-cut angle has a value of from about 0.5° to about 2°.

3. The device of claim 1, further comprising a buffer material positioned between the silicon on SSL formation structure and the SSL structure.

4. The device of claim 1 wherein the silicon SSL formation structure includes a silicon material with a Si(1,1,1) crystal orientation.

5. The device of claim 1 wherein the silicon SSL formation structure includes a silicon material with a Si(1,0,0) crystal orientation.

6. The device of claim 1 wherein the SSL structure is in direct contact with the silicon SSL formation structure.

7. The device of claim 1 wherein the support member comprises polyalumnium nitride.

8. The device of claim 1, further comprising a first material and a second material contained within the first material, the first and second materials being between the silicon SSL formation structure and the SSL structure.

9. A solid state lighting (SSL) device, comprising:
   a support member;

an SSL formation structure carried by the support member, the SSL formation structure having a first surface facing toward the support member and a second surface facing oppositely away from the first surface, the second surface having an off-cut angle with a non-zero value up to about 4.5°;

an SSL structure carried by the SSL formation structure, the SSL structure including a P-type region, and N-type region, and an active region between the p-type region and the N-type region;

a buffer material positioned between the silicon SSL formation structure and the SSL structure; and an interlayer structure between the buffer material and the SSL formation structure, wherein the interlayer structure includes at least two layers of gallium nitride and a quantity of silicon nitride between the two layers of gallium nitride.

10. A solid state lighting (SSL) device, comprising:

an SSL formation structure having a formation structure coefficient of thermal expansion (CTE); and an interlayer structure carried by the SSL formation structure, the interlayer structure including—
   a first material having a first material CTE greater than the formation structure CTE, and
   a second material stacked relative to the first material and positioned between a first portion of the first material and a second portion of the first material, the second material having a second material CTE less than the first material CTE.

11. The device of claim 10 wherein the difference between the second material CTE and the first material CTE is selected to provide a first force that counteracts a second force placed on the SSL formation structure by the first material.

12. The device of claim 10 wherein:
the SSL formation structure includes silicon; and
the device further comprises a polyaluminum nitride support member carrying the SSL formation structure.

13. The device of claim 10, further comprising a buffer material between the SSL formation structure and the interlayer structure.

14. The device of claim 10 wherein the second material is within 300 nm of the buffer material.

15. The device of claim 10 wherein:
the second material includes spaced-apart volumes of the second material; and
a third portion of the first material is disposed between the spaced-apart volumes of the second material.

16. The device of claim 10 wherein the first material includes gallium nitride and the second material includes silicon nitride.

17. The device of claim 10 wherein the first material is doped with a constituent of the second material.

18. The device of claim 10 wherein the first material is doped with silicon.

19. The device of claim 10 wherein the SSL formation structure has an off-cut angle with a non-zero value of up to about 4.5°.

20. The device of claim 10 wherein:
the SSL formation structure includes silicon; and
SSL formation structure has an off-cut angle with a value of from about 0.5° to about 2°.

* * * * *

UNITED STATES PATENT AND TRADEMARK OFFICE
CERTIFICATE OF CORRECTION

Page 1 of 1

PATENT NO.        : 8,729,563 B2
APPLICATION NO.   : 13/617846
DATED             : May 20, 2014
INVENTOR(S)       : Ji-Soo Park

It is certified that error appears in the above-identified patent and that said Letters Patent is hereby corrected as shown below:

On the title page, in item (57), in column 2, under "Abstract", line 7, delete "intelayer" and insert -- interlayer --, therefor.

In the Specification
In column 1, line 11, delete "8,436,362" and insert -- 8,436,362, --, therefor.

In the Claims
In column 8, line 50, in Claim 3, delete "silicon on" and insert -- silicon --, therefor.
In column 8, line 61, in Claim 7, delete "polyalumnium" and insert -- polyaluminum --, therefor.
In column 9, line 8, in Claim 9, delete "region, and" and insert -- region, an --, therefor.
In column 9, line 9, in Claim 9, delete "p-type" and insert -- P-type --, therefor.

Signed and Sealed this
Nineteenth Day of August, 2014

Michelle K. Lee
*Deputy Director of the United States Patent and Trademark Office*